United States Patent
Reboh et al.

(10) Patent No.: US 12,154,786 B2
(45) Date of Patent: Nov. 26, 2024

(54) METHOD FOR MODIFYING A STRAIN STATE OF AT LEAST ONE SEMICONDUCTOR LAYER

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Pablo Acosta Alba, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/693,637

(22) Filed: Mar. 14, 2022

(65) Prior Publication Data

US 2022/0293414 A1  Sep. 15, 2022

(30) Foreign Application Priority Data

Mar. 15, 2021 (FR) .................... 21 02523

(51) Int. Cl.
*H01L 21/02* (2006.01)
*H01L 21/3115* (2006.01)

(52) U.S. Cl.
CPC .... *H01L 21/0245* (2013.01); *H01L 21/02532* (2013.01); *H01L 21/31155* (2013.01)

(58) Field of Classification Search
CPC ........... H01L 21/0245; H01L 21/02532; H01L 21/31155; H01L 21/26506; H01L 21/26586; H01L 21/268; H01L 29/1054; H01L 29/66628; H01L 29/7847; H01L 29/161
See application file for complete search history.

(56) References Cited

U.S. PATENT DOCUMENTS

| | | | | |
|---|---|---|---|---|
| 7,851,325 B1 * | 12/2010 | Gaines | ................ | H01L 29/7846 438/149 |
| 9,570,298 B1 * | 2/2017 | Basker | ................ | H01L 21/0245 |
| 2005/0272229 A1 * | 12/2005 | Cao | ................... | H01L 21/02381 257/65 |

(Continued)

OTHER PUBLICATIONS

French Preliminary Search Report issued Nov. 17, 2021 in French Application 21 02523 filed on Mar. 15, 2021, 2 pages (with English Translation of Categories of Cited Documents).

(Continued)

*Primary Examiner* — Farun Lu
*Assistant Examiner* — Sandra Milena Rodriguez Villan
(74) *Attorney, Agent, or Firm* — Oblon, McClelland, Maier & Neustadt, L.L.P.

(57) ABSTRACT

A method for modifying a strain state of at least one semiconductor layer includes providing a support over which is arranged at least one stack of layers including the semiconductor layer and a fusible layer, arranged between the semiconductor layer and the support. The method also includes melting at least one portion of the fusible layer including the passage of said at least one portion of the fusible layer from a solid state into a liquid state, the semiconductor layer remaining in the solid state during the melting step. A laser beam may be used for the melting. The melting with the laser beam may also cause the modification of the strain state of the semiconductor layer.

23 Claims, 6 Drawing Sheets

(56) References Cited

U.S. PATENT DOCUMENTS

2008/0169508 A1* 7/2008 Chidambarrao .... H01L 29/7849
 438/154
2009/0111244 A1 4/2009 Yamazaki et al.
2014/0199813 A1 7/2014 Clifton

OTHER PUBLICATIONS

Morin et al., "A comparison of the mechanical stability of silicon nitride films deposited with various techniques", Applied Surface Science, 260, 2012, 4 pages.
La Magna et al., "LIAB: a FEniCS based computational tool for laser annealing simulation", FEniCS conference, 2017, 2 pages.
Hartmann et al., "Critical thickness for plastic relaxation of SiGe on Si(001) revisited", Journal of Applied Physics, 110, 083529, 2011, 9 pages.

* cited by examiner

METHOD FOR MODIFYING A STRAIN STATE OF AT LEAST ONE SEMICONDUCTOR LAYER

TECHNICAL FIELD AND PRIOR ART

The present application relates to the field of microelectronics and, more particularly, to that of methods allowing deforming or mechanically straining a semiconductor layer.

By mechanical deformation of a semiconductor layer, it should be understood that its material has its crystalline mesh parameter(s) extended or shortened.

In the case where the deformed mesh parameter is greater than the so-called "natural" parameters of a crystalline material, the latter is said in tensile deformation. When the deformed mesh parameter is less than the natural mesh parameter, the material is said in compressive deformation or in compression.

Mechanical strain states are associated to these mechanical deformation states. Nevertheless, it is also common to refer to these deformation states like mechanical strain states. In the remainder of the present application, this deformation concept will be referred to in a generic manner by the term "strain".

A strain applied to a semiconductor material induces a modification of the crystalline mesh and therefore of its band structure, from which a modification of the mobility of the carriers in this material will result.

The mobility of the electrons is increased (respectively decreased) by a tensile (respectively compressive) strain of the semiconductor material within which they transit while the mobility of the holes will be increased (respectively decreased) when the semiconductor is compressed (respectively tensioned).

Thus, to improve the performances of transistors, one could consider making their channel region in a semiconductor material having a tensile or compressive mechanical strain.

The document US 2008/0169508 A1 provides a method for manufacturing a semiconductor-on-insulator substrate including a silicon layer to be strained and an insulating layer based on doped silicate glass. A sacrificial strain donor layer made of silicon nitride is deposited over the silicon layer, then wafers are formed so as to enable a strain transfer into the semiconductor layer. Afterwards, the doped silicate glass layer is made to creep thereby causing a modification of the sacrificial layer, of the silicon layer.

Herein, the dopants used within the insulating later are necessary to allow carrying out this creeping.

Hence, a drawback of this solution is that it requires bringing in dopants such as boron and phosphorus in the buried oxide layer. Such dopants could then diffuse from the buried oxide layer towards the silicon layer, which might be detrimental in forming the channel of a transistor.

Another drawback of this solution is that it is limited to semiconductor-on-insulator type substrates.

Another drawback of this solution is also that subsequent annealing having a temperature higher than the creep temperature of the glass layer could cause an uncontrolled modification of the strain state of the strained layer.

More generally, the problem of finding a new method for modifying the strain state of a semiconductor layer arises.

DISCLOSURE OF THE INVENTION

The invention aims to enable a modification of a strain state of a semiconductor layer, preferably intended to be used in the context of manufacture of a microelectronic device such as a transistor.

To this end, according to one aspect, the present invention relates to a method for modifying a strain state of at least one semiconductor layer, the modification method including a step of providing a support over which at least one stack of layers is arranged including the semiconductor layer and a so-called "fusible" layer, the fusible layer being arranged between the semiconductor layer and the support. This modification method includes a heat treatment step so as to carry out melting of at least one region of the fusible layer, in order to cause the modification of the strain state of the semiconductor layer, the melting step including the transitional passage of said at least one region of the fusible layer from a solid state into a liquid state, at least one thickness of the semiconductor layer remaining in the solid state during the melting step.

Typically, the heat treatment is carried out using a laser beam. The use of the laser enables a quick and high thermal rise of the stack of layers.

In a particularly advantageous manner, the fusible layer is made of a semiconductor material, preferably non-doped. In this case, the fusible layer has not undergone any doping step prior to the heat treatment to carry out the melting.

Thus, an embodiment of the present invention relates to a method for modifying the strain state of at least one semiconductor layer comprising steps of:
a) making over a support at least one stack of layers including said semiconductor layer of a first semiconductor material and a fusible layer, said fusible layer being provided based on a second semiconductor material, distinct from the first semiconductor material, said fusible layer being arranged between the semiconductor layer and the support, then,
b) heat treatment, in particular a quick heat treatment, so as to cause a transitional passage of at least one thickness of the fusible layer in said stack from a solid state into a liquid state while keeping at least one thickness of the semiconductor layer in the solid state.

Through this heat treatment, a modification of the strain state of the semiconductor layer is induced.

Upon completion of the heat treatment step, a solidification of said at least one thickness of the fusible layer is carried out, the strain state of the semiconductor layer then being different from the strain state of the semiconductor layer before the implementation of the heat treatment step and the melting of the fusible layer.

The at least one thickness of the semiconductor layer kept at the solid state is that lying in contact with the strain donor layer or next to the donor layer.

Typically, the heat treatment is performed using a laser, in particular by subjecting the stack to one or several laser pulse(s). Upon completion of the laser treatment step, the return of the fusible layer to a solid state allows fixing the strain in the semiconductor layer.

The use of a laser allows for a quick thermal rise of the stack of layers to a predetermined temperature enabling the melting of the fusible layer and the strain modification in the semiconductor layer as mentioned before while avoiding an inadvertent diffusion of atoms in the stack while limiting the used thermal budget. Another advantage of such a treatment type is that the use of the laser beam enables the modification of the strain state in a spatially targeted manner.

Advantageously, the heat treatment step is performed using a laser by emission of one or several successive laser pulse(s), with a duration of each pulse shorter than one microsecond and preferably comprised between 10 ns and 1,000 ns, advantageously between 20 ns and 500 ns, the laser having a wavelength typically comprised between 100 nm and 550 nm and preferably between 250 nm and 400 nm.

Making of said stack may comprise steps of:
forming a superimposition of layers over said support comprising said fusible layer, said semiconductor layer and a strain donor layer, the strain donor layer being based on a material having a predetermined intrinsic tensile or compressive strain,
etching of said superimposition so as to define said at least one stack and delimit lateral edges of the strain donor layer and of the semiconductor layer.

Such a strain donor layer could allow applying a strain in the semiconductor layer, etching allowing structuring the stack and promoting strain transfer into the semiconductor layer. In the case where the donor layer is compressive, a stretching of the semiconductor layer is carried out, whereas in the case where the donor layer is tensioned (tensile), a compression of the semiconductor layer is implemented.

According to a particular implementation, the strain donor layer is made of silicon nitride.

According to a possible implementation of the method, in the superimposition of layers, the semiconductor layer may be arranged between the fusible layer and the strain donor layer.

According to an advantageous variant, the strain donor layer may be arranged between the fusible layer and the semiconductor layer. In the case where the strain donor layer is made of an amorphous material that could not be recrystallised, for example of an insulating material, having a strain donor layer arranged between the fusible layer and the semiconductor layer allows avoiding a transfer of dislocations from the fusible layer towards the semiconductor layer.

Thus, more generally, to avoid such a transfer of dislocations, one could advantageously provide for an amorphous intermediate layer and typically made of an insulating material between the fusible layer and the semiconductor layer whose strain state is to be modified.

According to another possible implementation, the strain donor layer is disposed above the semiconductor layer and the superimposition of layers includes an additional strain donor layer disposed under the semiconductor layer. In this case, it is thus advantageously possible to increase the strain transfer.

Typically, the second material and the first material are provided so as to pass into the liquid state at a temperature lower than that at which the first material could pass into the liquid state.

Advantageously, the second semiconductor material has a melting or liquidus temperature lower than the melting or liquidus temperature of said first semiconductor material.

Thus, in the case where the second semiconductor is a pure body, the second semiconductor material has a melting temperature lower than the melting temperature of said first semiconductor material when the first semiconductor material is a pure body or lower than the liquidus temperature of said first semiconductor material in the case where the latter is a semiconductor compound (also called alloy).

In the case where the second semiconductor material is a semiconductor compound, the second semiconductor material has a liquidus temperature lower than the melting temperature of said first semiconductor material when the first semiconductor material is a pure body or lower than the liquidus temperature of said first semiconductor material when the latter is a semiconductor compound.

Advantageously, the fusible layer is disposed over a superficial layer of the support made of a given material having a melting temperature higher than the melting or liquidus temperature of the second semiconductor material, so that during the heat treatment, said superficial layer remains in the solid state. Thus, while a melting of the fusible layer is carried out, the support is kept in a solid state.

Advantageously, the support may be a bulk semiconductor substrate, the fusible layer being disposed over the bulk semiconductor substrate.

According to another possible implementation, the fusible layer is disposed over an insulating layer of a semiconductor-on-insulator type substrate, the insulating layer being in particular made of silicon oxide.

Advantageously, the stack may be such that:
the first semiconductor material is silicon and the second semiconductor material is silicon-germanium or germanium,
or
the first semiconductor material is silicon-germanium and the second semiconductor material is silicon-germanium, with an atomic percent concentration of germanium higher than the atomic percent concentration of germanium of the first material,
or
the first material is formed by germanium and the second material is formed by germanium-tin.
or
the first semiconductor material is crystalline, the second semiconductor material is amorphous.

In the stack, when the first semiconductor material is crystalline, making of the stack may comprise at least one ion implantation so as to make the material of the fusible layer amorphous. Setting of the second semiconductor material in an amorphous state could allow reducing the temperature at which this material could be set in a liquid state.

Advantageously, the heat treatment for carrying out the melting is provided so as to:
heat up said thickness of the fusible layer to a temperature higher than or equal to a melting temperature of the second semiconductor material and higher than or equal to a liquidus temperature of the fusible layer when the fusible layer is formed by a semiconductor compound, while keeping at least one thickness of the semiconductor layer at a temperature lower than a melting temperature of the first semiconductor material and lower than a solidus temperature of the first semiconductor material when the semiconductor layer is formed by another semiconductor compound.

The fusible layer in the stack may be free of dopants. Thus, preferably, making of the stack does not include any doping step. Thus, an inadvertent diffusion of dopants is avoided during the heat treatment leading to the fusion.

The stack may include a strain donor layer having an intrinsic tensile strain and the method may comprise forming over the support, starting from said superimposition of layers, another stack topped by another strain donor layer, based on a material having an intrinsic compressive strain.

According to another aspect, the present invention relates to a method for manufacturing a transistor comprising the implementation of a modification method as defined hereinabove, the transistor having a channel region formed in the semiconductor layer whose strain is modified.

A method for straining at least one semiconductor layer comprising steps of:
a) making over a support at least one stack of layers including said semiconductor layer of a first semiconductor material and a so-called "fusible" layer, said fusible layer being provided based on a second semiconductor material, distinct from the first semiconductor material, said fusible layer being free of dopants and being arranged between the semiconductor layer and the support, said superimposition of layers further comprising a strain donor layer, then, b) quick heat treatment using a laser, of said stack and particularly of the fusible layer, so as to cause a transitional passage of at least one thickness of the fusible layer from a solid state into a liquid state while keeping at least one thickness of the semiconductor layer in the solid state, and enable a strain transfer into the semiconductor layer.

BRIEF DESCRIPTION OF THE DRAWINGS

The present invention will be better understood upon reading the description of embodiments, provided for purely indicative and non-limiting purposes, with reference to the appended drawings wherein.

Identical, similar or equivalent portions of the different figures bear the same reference numerals so as to facilitate the passage from one figure to another.

The different portions represented in the figures are not necessarily according to a uniform scale to make the figures more readable.

Furthermore, in the description hereinafter, terms that depend on the orientation, such as "over", "above", "upper", "lateral", etc. of a structure apply while considering that the structure is directed as illustrated in the figures.

DETAILED DISCLOSURE OF PARTICULAR EMBODIMENTS

An example of a method according to the invention, allowing modifying the strain state of a semiconductor layer 104, will now be given.

Figure 1A:
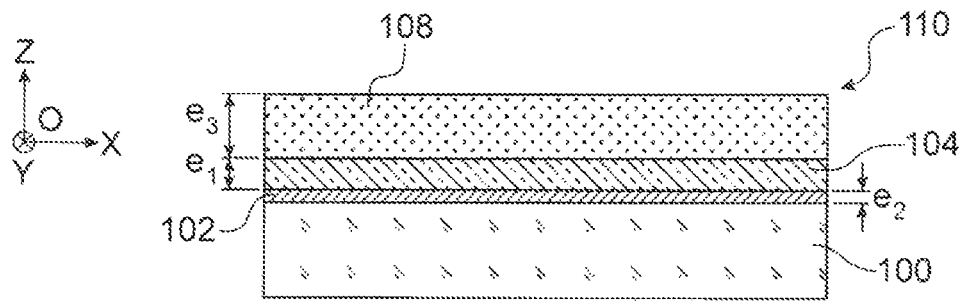
FIGS. 1A, 1B, 1C, 1D serve to illustrate steps of an example of a method for modifying the strain state of a semiconductor layer in a stack comprising a fusible layer that is transitionally made liquid.

Like in the example illustrated in FIG. 1A, the starting material may be a bulk substrate 100, for example made of silicon, serving as a support to a superimposition of layers.

The superimposition of layers includes a so-called "fusible" layer 102 and the semiconductor layer 104 in which it is desired to operate a strain modification, i.e. stress or increase the stress, or perform a relaxation.

The semiconductor layer 104 is provided in a first semiconductor material, for example silicon (Si), whereas the fusible layer 102, is based on a second semiconductor material, different from the first semiconductor material.

Advantageously, the first semiconductor material and the second semiconductor material may be selected according to their respective melting or liquidus temperatures.

Thus, preferably, the second semiconductor material has a melting temperature lower than the melting temperature of the first semiconductor material in the case where these two materials are pure bodies, the first semiconductor material being for example silicon and the second semiconductor material being for example germanium.

Advantageously, the second semiconductor material has a liquidus temperature lower than the melting temperature of the second semiconductor material in another case where, the first semiconductor material is for example a semiconductor compound also called semiconductor alloy such as silicon-germanium and the second semiconductor material a pure body such as germanium.

Advantageously, the second semiconductor material has a liquidus temperature lower than the liquidus temperature of the first semiconductor material in another case where, the first semiconductor material is for example a semiconductor compound (also called semiconductor alloy) such as silicon-germanium and the second semiconductor material another semiconductor compound such as silicon-germanium with a different composition, in particular with a higher Germanium concentration.

For example, the second semiconductor material may be based on Germanium or Silicon Germanium ($Si_{1-y}Ge_y$). In this case, it is possible to provide for a Ge concentration y typically comprised between 0.2 and 0.99, advantageously between 30 and 70% and more particularly between 40 and 60%, for example such that y=0.6.

The layers 102, 104 may be made for example by successive epitaxies, preferably without doping of the first and second semiconductor materials. In the illustrated example, the fusible layer 102 is arranged in contact over the substrate 100 and is coated by, and lies in contact with, the semiconductor layer 104.

In turn, the thickness $e_2$ of the fusible layer 102 (dimension measured parallel to the direction of the axis z of an orthogonal reference frame [O; x; y; z]) could advantageously be provided with a thickness smaller than its critical thickness for plastic relaxation as defined in particular in the document "Critical thickness for plastic relaxation of SiGe on Si(001) revisited" of J. M Hartmann et al. published in Journal of Applied Physics 110, 083529 (2011) in particular when it is made of silicon germanium and the support 100 is formed of silicon. Thus, the formation of dislocations in the semiconductor layer 104 during growth is avoided. The fusible layer 102 may be provided with a thickness $e_2$ comprised for example between 5 and 100 nm.

The semiconductor layer 104 may be provided with a thickness $e_1$ comprised for example between 5 nm and 150 nm.

To impart a strain in the semiconductor layer 104, a so-called "strain donor" layer in the superimposition of layers is used in this example. This strain donor layer 108 is based on a material having a predetermined intrinsic tensile or compressive strain. Preferably, the strain donor layer has a high intrinsic strain typically comprised between −8 GPa and 8 GPa (and typically between −2.5 and 2.5 GPa). Preferably, the material of the strain donor layer is selected so as to confer an elastic modulus of the same magnitude as or still preferably higher than that of the semiconductor layer 104. The material of the strain donor layer 108 is also selected so as to be fitted with a stable structure at a temperature of a heat treatment intended to be subsequently performed on the fusible layer 102 in order to set at least one thickness of the latter in a liquid state.

Thus, the material of the strain donor layer 108 is preferably selected so as not to become liquid or viscous and keep a high strain level, during the method for stressing the semiconductor layer 104 and in particular following the thermal budget imposed to enable the melting of the second semiconductor material.

For example, the strain donor layer 108 is made of silicon nitride (SiN), a material that a person skilled in the art knows how to obtain with an intrinsic compressive or tensile strain and for example comprised between −3 Gpa and +1.5 Gpa. Moreover, the melting temperature of silicon nitride is in the range of 1900° C., and therefore strictly higher than that of silicon and of most used semiconductors. This facilitates holding of the strain donor layer 108 in the solid state during the aforementioned heat treatment step intended to be carried out subsequently.

In the particular case of a thick semiconductor layer 104, in particular with a thickness larger than 15 nm, another advantage of silicon nitride is its low absorbance at the wavelength of UV lasers, and in particular its transparency at the wavelength of a laser likely to be used later on to perform the aforementioned heat treatment and allow operating a modification of the strain state of the semiconductor layer. SiN has a low absorbance at the wavelength of the UV lasers used to perform annealing of a semiconductor material. This allows depositing the energy of the laser beam more directly on the semiconductor stack, and therefore a higher heating efficiency. By "transparency", it should be understood a significant transmittance and preferably higher than 70%.

In the case of a thin semiconductor layer 104 and in particular with a thickness smaller than 15 nm, it is possible to select a distinct strain donor layer 108 that is not transparent to the laser, for example a TiN layer.

For example, the strain donor layer 108 is obtained from a chemical vapour deposition of silicon nitride, this deposition could be assisted by plasma. For example, the document "A comparison of the mechanical stability of silicon nitride films deposited with various techniques" of Pierre Morin et al. published in Applied Surface Science 260 (2012) 69-72 describes known techniques for depositing a silicon nitride strain layer.

For example, when the strain donor layer 108 is made of silicon nitride, its thickness $e_3$ may be comprised between 10 nm and 1 μm, advantageously between 30 nm and 200 nm.

Afterwards, a structuring of the strain donor layer 108 and of the semiconductor layer 104 is performed so as to define at least one stack 110 and delimit lateral edges of the semiconductor layer 104 and of the strain donor layer 108. Although only one stack is represented in FIG. 18, this structuring of the superimposition of layers could possibly lead to the formation of several distinct stacks.

The stack 110 may follow any kind of patterns that could be produced by known photolithography and/or etching processes. For example, a pattern with a rectangular or square or L-like shape, or possibly a disk-like shape, could be made. This shape may be selected according to the desired strain modification.

Figure 1B:
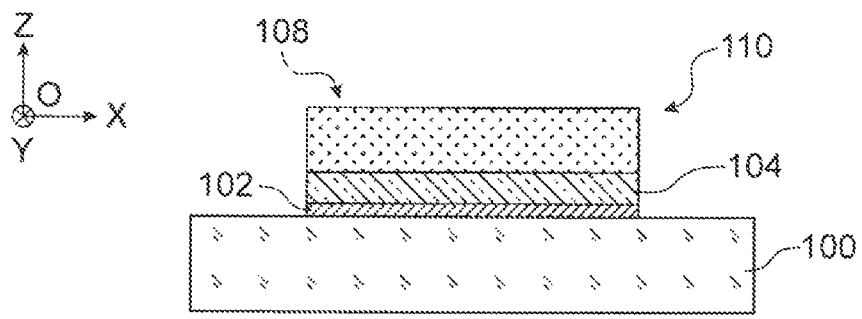

To perform the structuring and make one or several stack(s), an etching, for example using plasma, is implemented. In the example illustrated in FIG. 1B, the etching is extended in the fusible layer 102. Such a structuring is performed to subsequently enable a relaxation of the strain donor layer 108 could be operated and promote the strain transfer into the semiconductor layer 104.

To carry out the modification of the strain state in the semiconductor layer 104, at least one heat treatment is carried out afterwards, in particular a so-called "quick" heat treatment so as to perform a melting of at least one thickness of the fusible layer 102.

This melting step is transitional and thus includes the transitional passage of at least one given thickness of the fusible layer 102 from a solid state into a liquid state. While the fusible layer 102 or at least said thickness of the fusible layer is in a liquid state, the strain donor layer 108 could be deformed to partially relieve its strain and therefore set the semiconductor layer 104 or more generally modify the strain in the semiconductor layer 104.

Figure 1C:
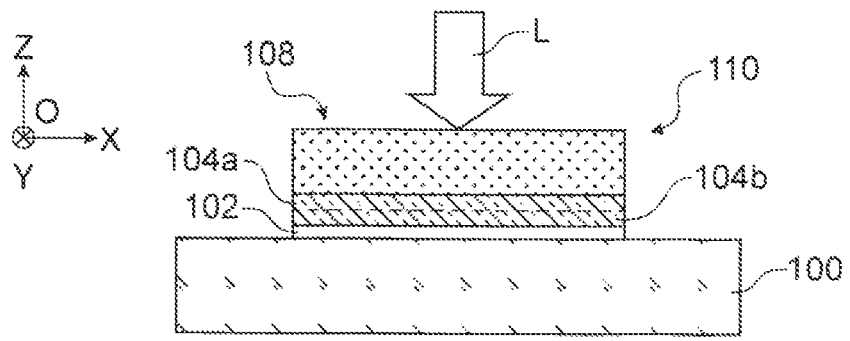

The fusible layer 102 may be made liquid across at least one portion of its thickness and according to at least one slice. Thus, the fusible layer 102 is not necessarily made liquid across the entire thickness thereof and is not necessarily made entirely liquid in a plane parallel to the main plane of the substrate. By "main plane" of the substrate, it should be herein understood a plane parallel to the plane [O; x; y] given in FIG. 1C.

Thus, at least one region of the fusible layer is heated up at a temperature higher than or equal to a melting temperature of the material.

Preferably, when the fusible layer is formed by a semiconductor compound also called semiconductor alloy, such as silicon germanium, the fusible layer 102 is set to a temperature higher than the liquidus temperature of this compound.

Heating and stacking 110 are also provided so that the semiconductor layer 104 remains in the solid state across at least one thickness 104a. This thickness 104a of the layer 104 kept in the solid state is that which is in contact with, or to the very least next to the donor layer 108. In turn, a thickness 104b of the layer 104 that lies in contact with the layer 102 could possibly be made at least partially liquid.

Nonetheless, preferably, the semiconductor layer 104 is kept in the solid state across the entire thickness thereof during the heat treatment. This is possible in particular by the different composition between the layers 102, 104 and in particular their differences of respective melting temperatures or of respective liquidus temperatures.

Preferably, the heat treatment is provided for so as to keep the semiconductor layer 104 at a temperature lower than its melting temperature. In the case where the semiconductor layer is formed by a semiconductor compound, for example such as silicon germanium, the semiconductor layer 104 is set to a temperature preferably lower than the solidus temperature of this compound.

In the case where the fusible layer 102 is made of Ge and the semiconductor layer 104 is made of silicon, the stack may be heated up to a temperature within the interval between 938° C. and 1413° C. to obtain a Ge layer in the liquid state without making the silicon liquid. For a configuration with a semiconductor layer 102 made of silicon and the fusible layer made of $Si_{1-y}Ge_y$, the stack is preferably heated up to a temperature located the liquidus line of the Si—Ge phase diagram. The higher the Germanium concentration y in the compound $Si_{1-y}Ge_y$, the wider will be the interval between the liquidus temperature and the melting temperature of Si. Hence, in this case, preferably, a fusible layer 102 made of $Si_{1-y}Ge_y$ is provided for with a high Ge concentration, for example higher than 30% or 40%.

By "quick" heat treatment, it should be herein understood a heat treatment lasting a short duration, typically shorter than one microsecond, typically between 20 and 1000 ns, preferably shorter than 200 ns and advantageously with a quick temperature rise to allow returning to a solid state and fix the strain in the semiconductor layer 104.

Typically, such a heat treatment is carried out using a laser L (FIG. 1C) which allows heating up to very temperatures, very quickly. An exposure to a laser also enables a quick cooling of the stack, once the exposure to the laser is stopped.

The melting of the layer 102 implemented through the aforementioned treatment allows relaxing the mechanical anchorage of the semiconductor layer 104 with respect to its support. A modification of the strain state of the semiconductor layer 104 results from this anchorage modification. Afterwards, the return of the fusible layer 102 to the solid state allows fixing the structure and therefore the modified strain state. The heat treatment step leading to the temporary melting of the fusible layer 102 enables a change in the strain state within the semiconductor layer 104.

In particular, the melting may be implemented by subjecting the stack 110 of layers to a single and possibly to several pulse(s) of a laser beam L, and in particular a so-called "nano-second" laser, i.e. with a pulse duration typically shorter than 1 microsecond. The use of a laser operating in a pulse mode allows limiting the thermal budget, while avoiding an excessive overall rise of the temperature of the rest of the stack 110. The wavelength of the laser L, the pulse duration of the laser beam and preferably the energy density of the laser beam are selected according to the stack 110 of layers, so as to enable melting, at least locally, of the material of the fusible layer 102 while keeping at least one thickness of the semiconductor layer 104 in the solid state.

The wavelength of the laser may be comprised between 100 nm and 550 nm, and preferably between 250 nm and 400 nm.

The duration of the, or of each, pulse of the laser beam may be comprised for example between 10 ns and 500 ns, and preferably between 100 ns and 200 ns.

At a given wavelength of the laser, the selected energy density of the laser beam depends on the reflectivity of the stack. Hence, this range may be enlarged and/or modified according to the completed stack. According to a particular embodiment, it is possible to provide for an energy density comprised between 0.01 and 2 J/cm². A person skilled in the art could rely on a combination of simulation tools for example as mentioned in the document "LIAB: a FEniCS based computational tool for laser annealing simulation", of Lamagna et al., 2017 and of physical characterisation tools using XRD imaging (X-ray diffractometry), SEM (Scanning electron microscopy), TEM (Transmission electron microscopy) to determine the accurate conditions according to the selected stack.

In the case where the semiconductor material of the fusible layer 102 is a compound, the implementation of a quick annealing and in particular by means of a laser L allows making this material melt quickly while avoiding a diffusion of elements of the compound towards the semiconductor layer 104. Thus, for example, in the case where the compound is SiGe, a diffusion of Germanium in the semiconductor layer 104, for example made of silicon, is avoided.

The fusible layer 102 being preferably free of dopants, the quick heat treatment carried out in particular by laser allows not to cause an inadvertent diffusion of dopants into the semiconductor layer 104.

Following the heat treatment and the last laser pulse emitted on the stack, the return of the fusible layer 102 to the solid state is done quickly typically within a duration shorter than 1 μs for treatment conditions and thicknesses like in the aforementioned embodiments.

During melting and transitional setting in a liquid state of the fusible layer, the support of the latter is preferably kept in a solid state. Thus, the superficial layer of the support over which the fusible layer 102 could be disposed is in contact with a given material preferably having a higher melting temperature or a liquidus temperature higher than the melting or liquidus temperature of said second semiconductor material, so that during the quick heat treatment, said superficial layer remains in the solid state. Where appropriate, the first semiconductor material and the given material could be the same material. This is the case, for example, in the above-mentioned case, of a bulk substrate made of silicon for a semiconductor layer made of silicon.

According to an advantageous mode, in particular when the fusible layer 102 is made of $Si_{1-y}Ge_y$ with y≤0.5, the semiconductor layer 104 whose strain is to be modified could be provided to be thicker and for example at least twice thicker than the absorption length of the used laser. This could allow counterbalancing a reflection local effect of the laser by the fusible layer 102. The absorption length of the laser could be obtained while considering the intensity of the laser according to the depth and while considering for example that for a 1/e intensity, e being the Euler number equal to about 2.71828, corresponding to 37% of the intensity, which corresponds to 10 nm (10 nm has absorbed 63%). For Si, the absorption length of a UV laser (308 nm of wavelength) is substantially equal to 10 nm, and therefore to avoid a reflection local effect, a thickness of the silicon layer 104 strictly larger than 20 nm is selected.

In the case where the semiconductor layer 104 is provided with a thickness smaller than 20 nm, a fusible layer 102 made of $Si_{1-y}Ge_y$ with y this time higher than 0.5, is advantageously provided for, allowing lowering the melting temperature of the fusible layer 102 which allows limiting the energy to be supplied to male this layer melt and therefore limit the reflection local effect.

Figure 1D:
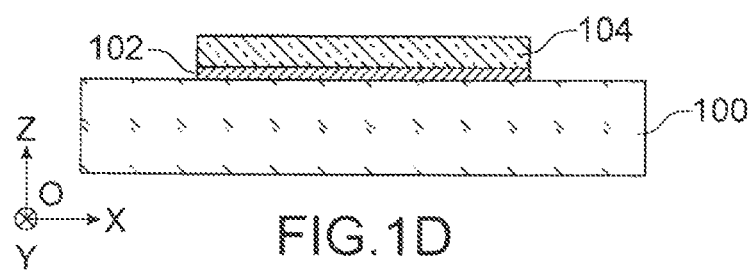

Once the strain modification is implemented, it is possible to remove the strain donor layer 108 is made of silicon nitride, an annealing by etching, for example a wet etching using HF or orthophosphoric acid or a plasma etching could be performed (FIG. 1D).

Afterwards, it is possible to carry on steps of making a microelectronic and/or optoelectronic device and make one or several component(s) at least partially in the semiconductor layer 104, in particular one or several transistor(s), whose channel region extends in this semiconductor layer 104.

A method for modifying the strain state as described before could be applied to a stack having a stack 110 different from the stack 110 provided for in the embodiment that has just been given.

Figure 2:
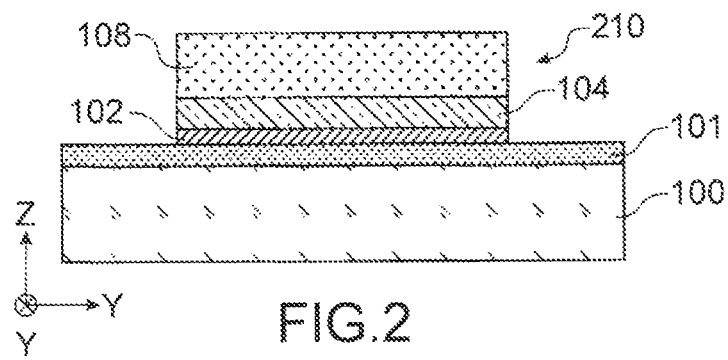
FIG. 2 serves to illustrate a variant of a stack from which steps of a method, according to the invention, for modifying the strain state of a semiconductor layer could be implemented.

Thus, according to a variant of the method illustrated in FIG. 2, it is possible to perform the quick heat treatment leading to the strain modification on a stack 210 including the fusible layer 102, the semiconductor layer 104, the strain donor layer 108, as well as an interlayer between the support 100 and the fusible layer 102. This interlayer may be an insulating layer 101, in particular a layer for insulating a semiconductor-on-insulator type substrate, typically a silicon oxide ($SiO_2$) layer commonly called "BOX" standing for ("buried oxide"). The BOX may have a thickness comprised between 10 nm and 150 nm, preferably the thickness of the BOX is smaller than 25 nm. More specifically, when the layer 104 has a thickness smaller than or equal to 20 nm, the thickness of the BOX is comprised between 10 nm and 150 nm and when the layer 104 has a thickness larger than 20 nm, the thickness of the BOX is smaller than 25 nm.

Figure 3:
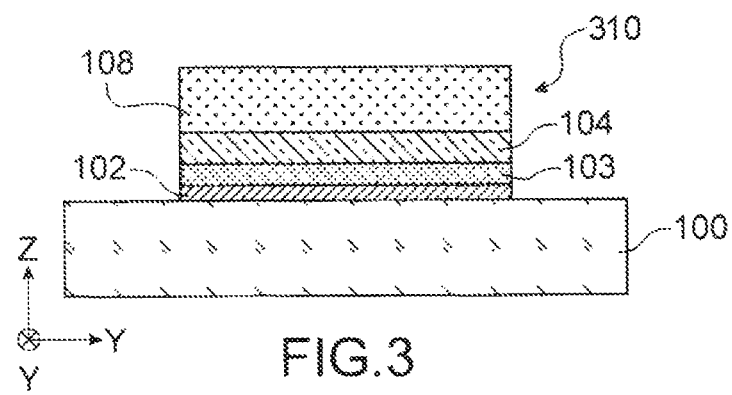
FIG. 3 serves to illustrate another variant of said stack in which an interlayer is provided between the fusible layer and the semiconductor layer whose strain is to be modified.

In the embodiment illustrated on FIG. 3, an interlayer is this time arranged between the fusible layer 102 and the semiconductor layer 104. This interlayer may also be an insulating layer 103, for example a silicon oxide layer ($SiO_2$). Such a stack is typically obtained by layer transfer. For example, it is possible to affix on the support 100 coated with the fusible layer 102, a substrate fitted with a semiconductor basis containing the semiconductor layer 104 and coated with the insulating interlayer 103. Then, once a gluing is performed, a portion of the basis is removed so as to keep only the semiconductor layer 104 either by a smartcut™ type process or by a thinning process using one or several CMP ("Chemical mechanical planarisation") steps.

Figure 4:
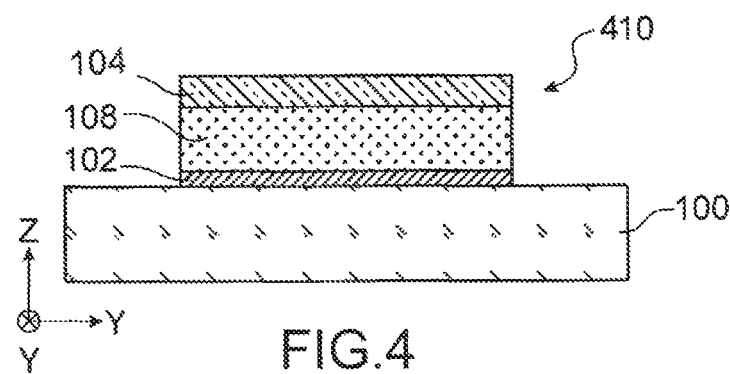
FIG. 4 serves to illustrate another variant of said stack in which a strain donor layer is this time provided beneath the semiconductor layer whose strain is to be modified and over the fusible layer.

The strain donor layer 108 is not necessarily arranged above the semiconductor layer 104 whose strain is to be modified. Thus, in the example illustrated in FIG. 4, a stack 410 is provided wherein the strain donor layer 108 is this time located between the fusible layer 102 and the semiconductor layer 104 and could be disposed in particular beneath, and in contact with, the semiconductor layer 104.

Figure 5:
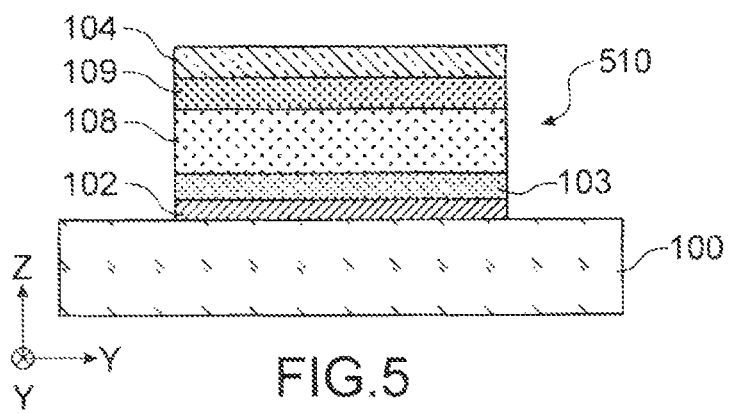
FIG. 5 serves to illustrate another variant of said stack in which several interlayers are provided between the semiconductor layer whose strain is to be modified and the fusible layer.

An arrangement variant of the previous embodiment provides this time for a stack 510 fitted with an interlayer 109, for example made of silicon oxide ($SiO_2$), between the semiconductor layer 104 whose strain is to be modified and the strain donor layer 108, therebeneath in this instance. Another interlayer 103, which could be insulating and for example made of silicon oxide ($SiO_2$), is also provided for, as in FIG. 5, this time between the strain donor layer 108 and the underlying fusible layer 102.

Figure 6:
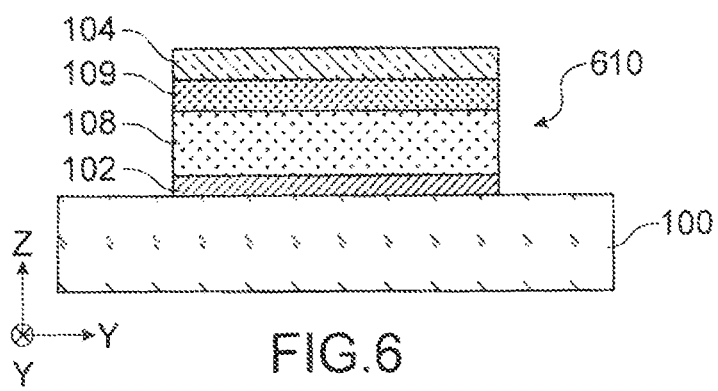
FIG. 6 serves to illustrate another variant of said stack in which an interlayer is provided between the semiconductor layer whose strain is to be modified and an underlying strain donor layer.

In another arrangement variant illustrated in FIG. 6, the stack 610 is this time fitted with the interlayer 109, for example made of silicon oxide ($SiO_2$), between the semiconductor layer 104 and the strain donor layer 108, whereas the strain donor layer 108 is this time disposed over, and in contact with, the fusible layer 102.

In particular in order to increase the strain transfer into the semiconductor layer 104, another variant provides for introducing at least one additional strain donor layer 108'.

Figure 7:
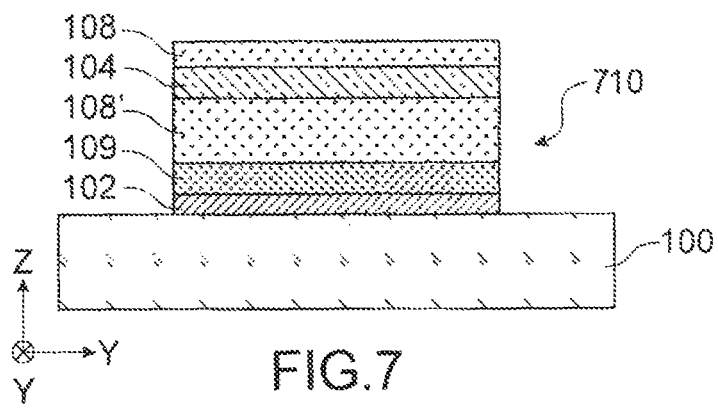
FIG. 7 serves to illustrate another variant of said stack with a strain donor layer over the semiconductor layer and an underlying additional strain donor layer.

Thus, this strain donor layer 108' is based on a material having an intrinsic tensile or compressive strain. The strain donor layers 108, 108' may be based on identical materials, for example silicon nitride. It is possible to provide for a so-called "upper" strain donor layer 108 disposed over the semiconductor layer 104 and advantageously in contact with the latter and an additional so-called "lower" strain donor layer 108' disposed beneath the semiconductor layer 104 and advantageously in contact with the latter. In the particular embodiment illustrated in FIG. 7, the stack 710 thus includes strain donor layers 108, 108' respectively over and beneath the semiconductor layer 104. Besides the aforementioned layers 108, 108', the stack 710 herein includes an interlayer 103, for example made of silicon oxide ($SiO_2$), between the fusible layer 102 and the lower strain donor layer 108'.

An interlayer between the strain donor layer 108 and the semiconductor layer 104 could possibly be provided for in each of the variants of the present description. Typically, such an interlayer, made for example of silicon oxide ($SiO_2$) may have a thickness comprised between 1 nm and 3 nm of thickness.

A quick heat treatment step as described before in order to operate a modification of a strain of a semiconductor layer 104 is not necessarily carried out on only one stack. Indeed, such a step could be carried out on several distinct stacks and each fitted with a fusible layer 102 and with a semiconductor layer 104 whose strain is to be modified. Such stacks may be made by etching, for example by forming one or several wafer(s) through a superimposition of stacks according to either one of the previously-described possibilities.

Figure 8:
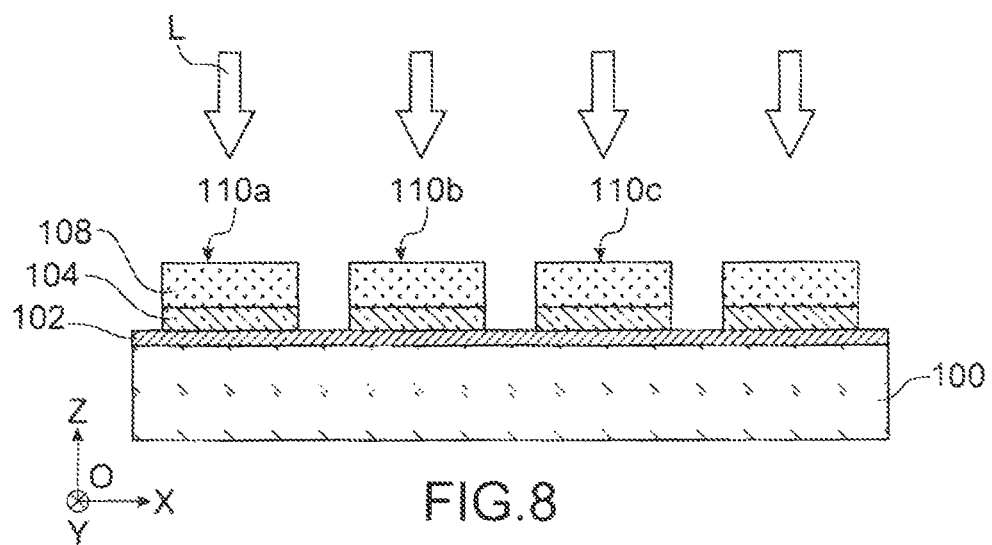
FIG. 8 serves to illustrate another variant in which the laser treatment is performed to make liquid a fusible layer in several distinct stacks each fitted with a semiconductor layer which strain is to be modified.
Figure 9:
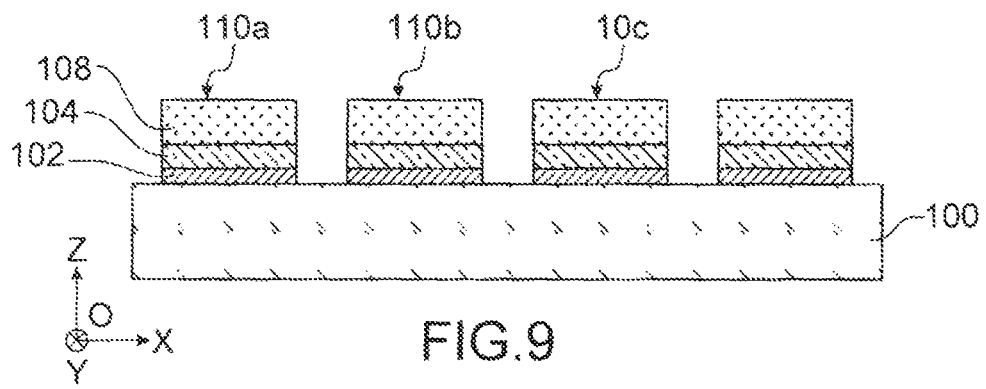
FIG. 9 serves to illustrate another variant in which the fusible layer is also structured before performing the laser treatment to make the latter liquid.
Figure 10:
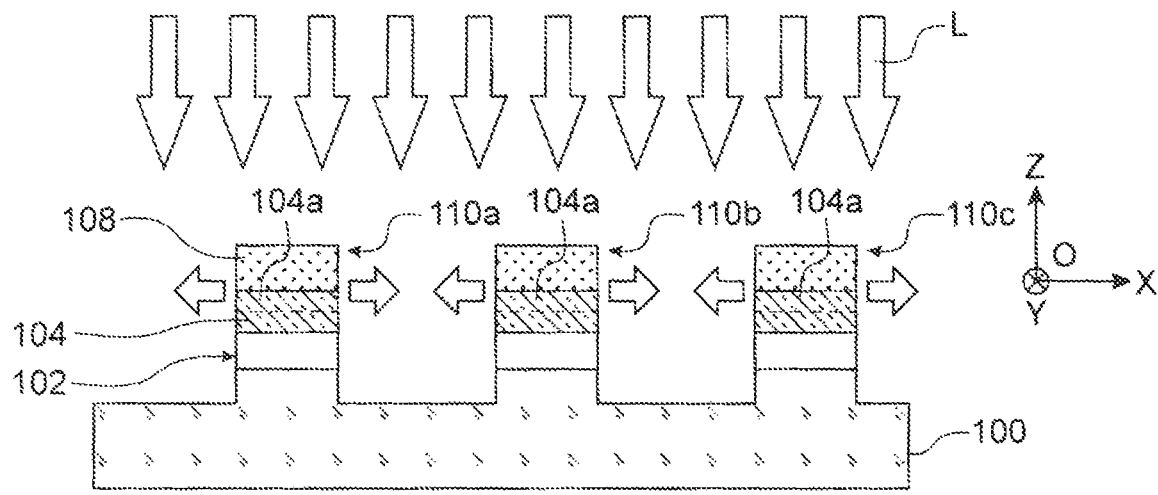
FIG. 10 serves to illustrate another variant in which the structuring of the stack is extended in a superficial layer of the substrate serving as a support to the fusible layer.

In the example illustrated in FIGS. 8, 9, 10, each of the stacks 110a, 110b, 110c is fitted with a strain donor layer 108.

The fusible layer 102 may be kept "full plate" or continuous, like in FIG. 8, without making any pattern or etching the latter in a subsequent step after deposition thereof and in particular during etching of the stack.

Alternatively (FIG. 9), the fusible layer 102 may be etched in the continuation of the semiconductor layer 104 as has been described before in connection with FIG. 1B.

Another variant provides this time for a structuring of the stacks 110a, 110b, 110c by extended etching in a portion of the layer located beneath the fusible layer 102.

In the embodiment illustrated in FIG. 10, this etching is extended in a superficial thickness of the support to the fusible layer and which could for example be a bulk substrate 100.

In each of the embodiments illustrated in FIGS. 8, 9, 10, the stacks 110a, 110b, 110c, obtained by structuring could be exposed successively or simultaneously to one or several laser L pulse(s) to perform a heat treatment as described before. In each stack exposed to the laser L, it is possible to make a thickness of the fusible layer 102 topped by the semiconductor layer 104 itself placed opposite the strain donor layer 108 is made liquid while at least one thickness 104a thereof is kept in the solid state during this exposure. Herein again, the thickness 104a or region of the layer 104 that lies next to the donor layer 108 is kept in the solid state.

Depending on the desired strain modification, it is possible to seek to make the patterns formed in the liquid layer 102 completely liquid.

Figure 11:
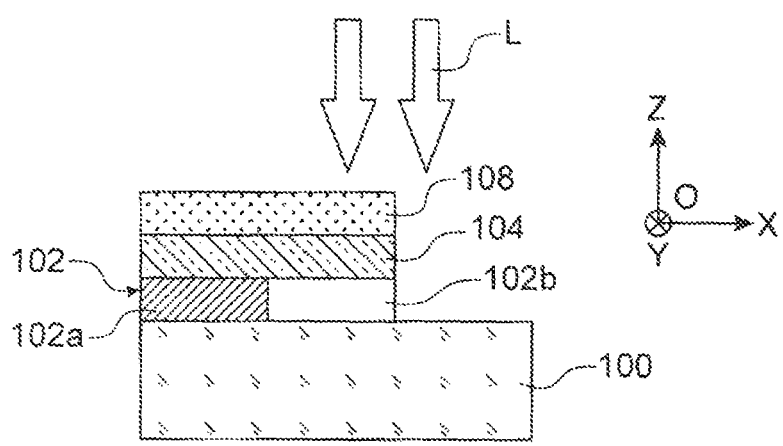
FIG. 11 serves to illustrate another variant in which a laser treatment is performed to make a region of the fusible layer liquid while preserving an adjacent area from exposure in order to keep it non-liquid.

Alternatively, the quick heat treatment step may be provided for so as to make a localised thickness of the fusible layer 102 in a liquid state, i.e. without necessarily making this liquid fusible layer entirely in a plane parallel to the main plane of this layer. By "main plane" of a layer, it should be understood herein and in the entire description, a plane parallel to the plane [O; x; y]. Thus, in the embodiment illustrated in FIG. 11, melting of a thickness 102b of the fusible layer topped by the semiconductor layer 104 itself placed opposite the strain donor layer is carried out using a laser L, whereas an area 102a of the fusible layer juxtaposed to this thickness 102a is not exposed to the laser L, in order to keep it in a solid state.

This could be achieved for example by forming a laser-reflective layer over the area 102a that should be kept solid.

A quick heat treatment by laser as described before could be carried out to implement strain modifications of different types on different semiconductor regions of the same support. Thus, a tensioning of a semiconductor region and a compression of another semiconductor region could be carried out on the same support. According to another possibility, it is possible to compress or tension a semiconductor region and carry out a relaxation of another semiconductor region, that being so over the same support. For example, such a process type could be carried out in the case of a co-integration of P-type and N-type transistors whose channel regions have opposite strains.

Figure 12:
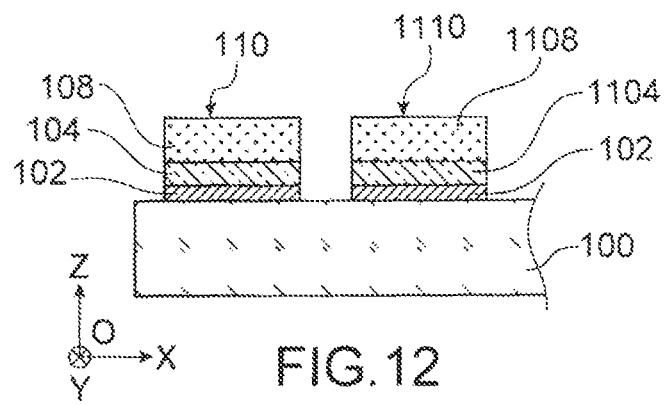
FIG. 12 serves to illustrate another variant in which the laser treatment enabling a strain modification is performed on distinct stacks fitted with strain donor layers having intrinsic strains of different types.

Thus, for example, it is also possible to apply a quick heat treatment as described before on distinct stacks 110, 1110 as represented in FIG. 12. These stacks 110, 1110 are fitted with different strain donor layers 108, 1108 i.e. having different intrinsic strains and which could be opposite to each other. In particular, it is possible to provide for a first stack 110 with the fusible layer 102, the semiconductor layer 104 and the strain donor layer 108, typically made of silicon nitride and having a given intrinsic strain, for example a tensile strain. In turn, a second stack 1110 is fitted with a second strain donor layer 1108, typically made of silicon nitride, having an intrinsic strain of a type opposite to that of the first layer 108, for example an intrinsic compressive strain. The second strain donor layer 1108 is arranged over a semiconductor portion denoted 1104 which could be made of a material distinct from that of the semiconductor layer 104 or which could be initially derived from the same semiconductor layer 104, but separated from the latter by a wafer for example made by etching.

In the particular case, provided as example, where the first strain donor layer 108 is fitted with an intrinsic tensile strain whereas the second strain donor layer 1108 has an intrinsic compressive strain, it is possible to set the semiconductor layers 104, 1104 respectively in compression or in tension.

Pairs of materials other than those mentioned in the previously-described examples may be used respectively for the semiconductor layer 104 and the fusible layer 102.

Thus, for example, it is also possible to provide the semiconductor layer 104 and the fusible layer 102 each made of silicon-germanium but with different respective Germanium concentrations. The atomic percent concentration of germanium in the second semiconductor material (i.e. in the fusible layer 102) is in this case higher than the atomic percent concentration of germanium in the first semiconductor material (i.e. in the semiconductor layer 104) in order to enable a selective melting of the fusible layer 102 during the step of heat treatment by laser, i.e. without making the semiconductor layer 104 melt or to the very least while keeping at least one thickness solid in the latter. As indicated before, at least one thickness of the semiconductor layer 104, which lies proximate to and/or in contact with the strain donor layer 108 or next to the strain donor layer 108, is kept solid.

In order to facilitate the melting of the fusible layer 102 while preventing that of the layer 104 of the semiconductor layer or while preventing that of the layer 104 of the semiconductor layer across the entire thickness thereof, it is possible to select suitable semiconductor materials according to the temperatures enabling setting thereof in a liquid state. Thus, preferably, the melting temperature of the fusible layer 102 is lower than the melting temperature of the semiconductor layer 104 and possibly lower than the solidus temperature of the semiconductor layer 104. The liquidus temperature of the fusible layer 102 is provided lower than the melting temperature of the semiconductor layer 104 and possibly lower than the solidus temperature of the semiconductor layer 104.

According to another example, it could be provided that the first semiconductor material (of the fusible layer 102) is germanium whereas the second semiconductor material (of the semiconductor layer 104) is based on germanium and tin.

Figure 13:
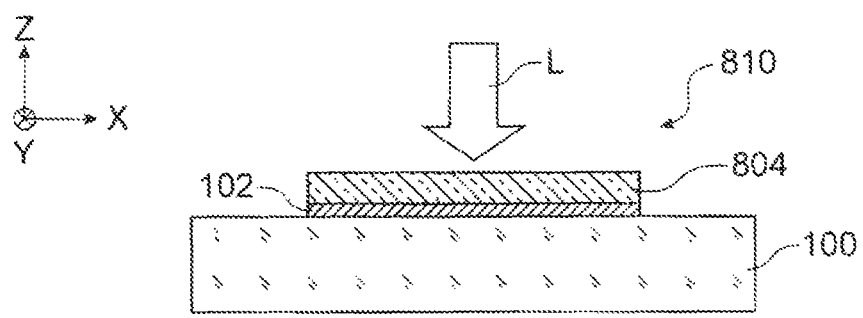
FIG. 13 serves to illustrate another variant in which a laser treatment enabling a strain modification of a strained semiconductor layer is performed.

Another variant provides this time for carrying out the heat treatment step leading to the transitional setting of a fusible layer 102 in a liquid state, over a stack 810 free of strain donor layers as described before. Such a stack 810, illustrated in FIG. 13, is this time fitted with a semiconductor layer 804 based on a tensile or compressive strained first semiconductor material.

Straining of the layer 804 could have been performed beforehand, for example using a semiconductor material having a mesh parameter different from that of the semiconductor layer 804.

According to one example, a semiconductor layer 804 in a compressive strain state before the modification of its strain state, could be obtained as follows. A growth, by epitaxy over a silicon support 100, of a first silicon-germanium layer is carried out at first. This first silicon-germanium layer has a germanium concentration strictly lower than 25%, for example equal to 50%, and a thickness comprised between 5 nm and 30 nm. This first silicon-germanium layer allows forming the fusible layer 102. Afterwards, a second silicon-germanium layer is formed over the first silicon-germanium layer, for example by growth by epitaxy over the first silicon-germanium layer. This second silicon-germanium layer has a germanium concentration lower than that of the first layer and for example equal to 10% and a thickness comprised for example between 10 nm and 30 nm. This second silicon-germanium layer allows forming the semiconductor layer 804. A structuring typically by photolithography and etching of the second silicon-germanium layer and possibly the first silicon-germanium layer allows delimiting the stack 810.

According to another example, a semiconductor layer is in a tensile strain state before the modification of its strain state. Such a layer 804 could be obtained as follows. A growth, by epitaxy over a support 100, of a relaxed silicon-germanium layer is carried out. This silicon-germanium layer has a germanium concentration comprised between 15% and 30%. This relaxed silicon-germanium layer allows forming the fusible layer 102 of a support layer for the material of the fusible layer 102 which could be deposited over the relaxed silicon-germanium layer in order to form a strained fusible layer 102. Afterwards, over the fusible layer 102, a semiconductor layer 804 is formed, for example by growth by epitaxy. The semiconductor layer 804 may be made of silicon, and have a thickness comprised for example between 10 nm and 30 nm. Afterwards, a structuring of the semiconductor layer 804 and possibly of the fusible layer 802 by etching is carried out.

Afterwards, the stack 810 is exposed to one or several laser pulse(s), according to a quick heat treatment step as described before. The strain modification induced by the heat treatment and the transitional setting in the liquid state of the fusible layer 102, could for example allow performing a relaxation of the semiconductor layer 804.

According to a particular embodiment of the method, in order to promote the selective melting of the fusible layer 102 during the previously-described quick heat treatment, it is possible to provide for this layer being based on a semiconductor material that is amorphous or made amorphous. The first semiconductor material forming the semiconductor layer 104 is then crystalline, for example crystalline silicon and the second semiconductor material forming the fusible layer 102 is amorphous, for example silicon or amorphous silicon-germanium. Indeed, it is possible to lower the temperature at which the second semiconductor material passes into the liquid state by making it pass from its crystalline form into its amorphous form. Indeed, the amorphous silicon-germanium has a liquidus temperature lower than that of the crystalline silicon-germanium, the liquidus temperature of the crystalline silicon-germanium being lower than the melting temperature of the crystalline silicon. The temperature at which the second semiconductor material passes into the liquid state is lowered even more as the germanium concentration of the fusible layer 102 of silicon-germanium is significant.

Figure 14:
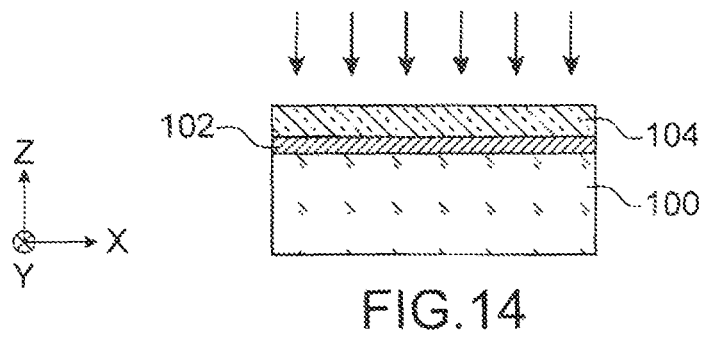
FIG. 14 serves to illustrate an amorphisation of the fusible semiconductor layer by ion implantation in order to lower the temperature at which this layer could then be made at least partially liquid.

The second semiconductor material forming the fusible layer 102 may be made amorphous by ion implantation. Such an implantation is carried out before the heat treatment step leading to melting of the fusible layer 102. As illustrated in FIG. 14, such a step could be carried out before depositing the strain donor layer 108. Alternatively, it is possible to carry out this amorphisation step after depositing the strain layer.

The ion implantation is performed so as to make at least one thickness of the fusible layer 102 amorphous with an implantation profile such that the semiconductor layer 104 keeps its crystalline structure.

The implantation conditions for the amorphisation of at least one thickness of the semiconductor fusible layer 102 could be defined using a simulation tool such as a C-TRIM (CTRIM standing for "Crystal Transport of Ions in Matter") type software using Monte Carlo algorithms.

For a given implanted species, the implantation energy is calculated so as to place a defect peak, in other words a maximum displacement of atoms of the matrix at the fusible layer 102. Preferably, the implantation is carried out with an angle enabling channeling of the ions in the crystalline structure of the layer 104 in order to preserve this structure as much as possible. Typically, this is obtained with a 0 degree angle with respect to a normal to the main plane of the substrate for a typical substrate 001.

For the specific case of a layer 104 made of Si and of a layer 108 made of SiGe, Si ions could be used for example. The implanted dose is calculated so as to cause the amorphisation of the SiGe layer. A typical range of a dose for SiGe could lie between $1.5^e14$ and $3^e14$ at/cm2.

The amorphising implantation may be carried out using an inert species, non-dopant for the implanted semiconductor material, for example Si atoms. By "inert species", it should be herein understood a species that is not intended to modify the electrical properties of the implanted semiconductor material. For example, a fusible layer 102 made of SiGe with a thickness comprised for example between 5 and 50 nm and in particular between 5 and 30 nm is implanted with a Germanium concentration provided for between 20 and 70%, preferably 25-60%, topped by a silicon layer 104 with a thickness comprised for example between 5 and 50 nm and in particular between 5 and 20 nm.

A structure obtained upon completion of the strain modification method as described before has applications in the microelectronics and/or photonics fields.

In particular, a structure obtained upon completion of the modification method could be used to form at least one transistor whose channel region has a strain level adapted according to the type of charge carriers it is intended to convey. Either one of the sequences of steps described before and enabling a modification of a strain of at least one semiconductor layer could thus be integrated to a method for manufacturing at least one microelectronic component, in particular of at least one transistor.

Once a strain modification method has been performed, it is possible to start from a structure for example as described in connection with FIG. 1D to manufacture the transistor.

Thus, starting from the stack successively including the substrate 100 serving as a support, the fusible layer 102, the semiconductor layer 104, the method for manufacturing a transistor T may include afterwards steps of forming a gate dielectric 1501 and a gate electrode 1503. This could be achieved through successive depositions and etching(s) of a gate dielectric layer, for example made of $SiO_2$ and of at least one gate material layer, for example made of polysilicon.

Insulating spacers 1505 may also be formed on either side of sidewalls of the gate electrode for example by deposition of a silicon nitride based layer and then by anisotropic etching.

Figure 15:
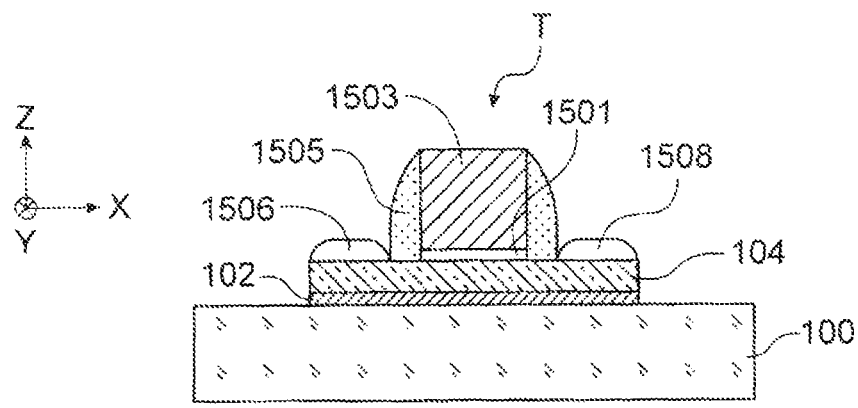
FIG. 15 serves to illustrate making of a transistor from a structure obtained upon completion of a method for modifying the strain of a semiconductor layer as implemented according to an embodiment of the present invention.

Steps of forming source 1506 and drain 1508 regions are also performed. A typical method for making these regions comprises a growth by epitaxy of semiconductor material blocks over the semiconductor layer 104. These semiconductor blocks could be doped and contact areas could be made for example by silicidation of these semiconductor blocks (FIG. 15).

Thus, it is possible to benefit from a semiconductor layer 104, strained with a strain level adapted to form a transistor T channel region.

Figure 16A:
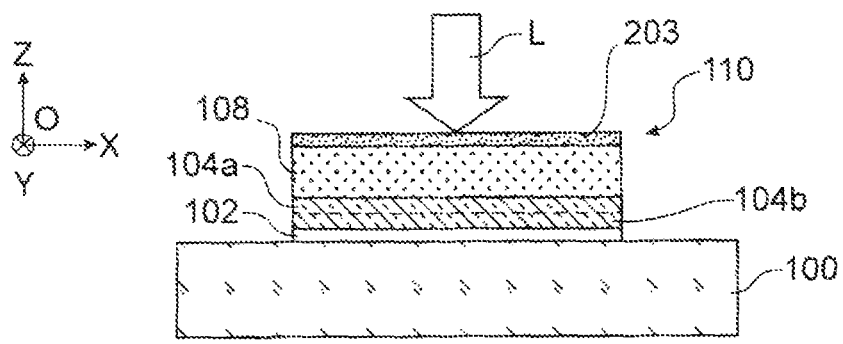
FIGS. 16A and 16B serve to illustrate some variants.
Figure 16B:
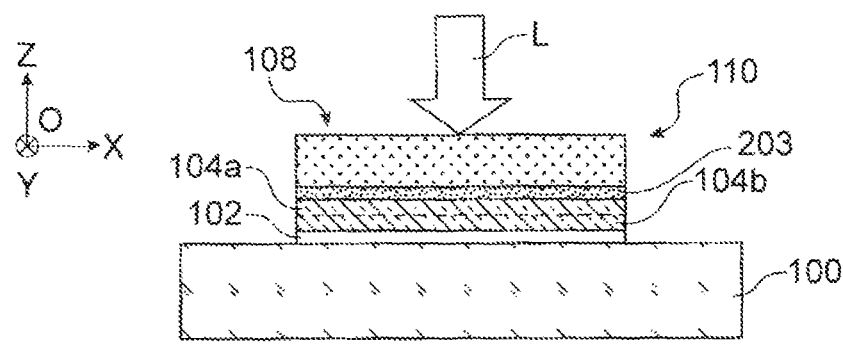

In a variant illustrated in FIGS. 16A and 16B, it is possible to provide for integrating in the superimposition of layers which is subjected to a laser radiation to carry out the transitional melting of a fusible layer 102, a layer 203 for absorbing the energy of the laser L. Such a layer 203 is provided in terms of thickness and of composition so as to absorb and transfer heat by conduction in order to avoid a reflection of photons by the fusible layer 102. In particular, this absorption layer 203 may be disposed over the upper portion of the stack, for example over the strain donor layer 108 (FIG. 16A) or may be arranged between the strain donor layer 108 and the layer 104 whose strain is to be modified. For example, the absorption layer 203 may be made of amorphous carbon or amorphous silicon or based on crystalline silicon in the case of FIG. 16A where it is located over the strain donor layer 108.

The invention claimed is:

1. A method for modifying a strain state of at least one semiconductor layer comprising:
   a) forming over a support at least one stack of layers including said at least one semiconductor layer of a first semiconductor material and a fusible layer, said fusible layer being based on a second semiconductor material, distinct from the first semiconductor material, said fusible layer being free of dopants and arranged between the at least one semiconductor layer and the support, said at least one stack of layers further comprising a strain donor layer, the strain donor layer being based on a material having an intrinsic tensile strain, the forming of said at least one stack comprising:
   forming the at least one stack of layers over said support comprising said fusible layer, said semiconductor layer, the strain donor layer, and
   etching said at least one stack of layers so as to define said at least one stack and delimit lateral edges of the semiconductor layer, the etching of said at least one stack of layers being carried out so as to delimit lateral edges of the strain donor layer based on a material having an intrinsic tensile strain,
   the method further comprising, starting from said at least one stack of layers, forming, over said support, another stack topped by another strain donor layer based on a material having an intrinsic compressive strain,
   then,
   b) quick heat treatment of the fusible layer in said at least one stack using a laser, so as to cause a transitional passage of at least one thickness of the fusible layer from a solid state into a liquid state while keeping at least one thickness of the semiconductor layer in the solid state.

2. The method according to claim 1, comprising, in said at least one stack of layers, arranging the strain donor layer between the fusible layer and the semiconductor layer.

3. The method according to claim 1, wherein the strain donor layer is disposed above the semiconductor layer and wherein the at least one stack of layers includes an additional strain donor layer disposed beneath the semiconductor layer.

4. The method according to claim 1, wherein the second semiconductor material has a melting or liquidus temperature lower than a melting or liquidus temperature of said first semiconductor material.

5. The method according to claim 1, wherein the fusible layer is disposed over and in contact with a superficial layer of said support made of a given material having a melting or liquidus temperature higher than a melting or liquidus temperature of said second semiconductor material, so that during the quick heat treatment, said superficial layer remains in the solid state.

6. The method according to claim 1, wherein the support is a bulk semiconductor substrate, the fusible layer is disposed over the bulk semiconductor substrate or wherein the fusible layer is disposed over an insulating layer.

7. The method according to claim 1, wherein in said at least one stack:
   said first semiconductor material is silicon and said second semiconductor material is silicon-germanium or germanium, or
   said first semiconductor material is silicon-germanium and the second semiconductor material is silicon-germanium, with an atomic percent concentration of germanium higher than an atomic percent concentration of germanium of the first semiconductor material, or
   the first semiconductor material is formed of germanium and the second material is formed of germanium-tin.

8. The method according to claim 7, wherein in said at least one stack the first semiconductor material is crystalline, and the second semiconductor material is amorphous.

9. The method according to claim 7, wherein in said at least one stack said first semiconductor material is crystalline, the forming of said at least one stack comprising at least one ion implantation so as to make said second semiconductor material of the fusible layer amorphous.

10. The method according to claim 7, the heat treatment being performed using a laser by emission of one or several successive laser pulse(s), with a pulse duration shorter than one microsecond and preferably comprised between 10 ns and 1,000 ns the laser having a wavelength comprised between 100 nm and 550 nm.

11. The method according to claim 1, the heat treatment comprising:
   heating up said thickness of the fusible layer to a temperature higher than or equal to a melting temperature of the second semiconductor material and higher than or equal to a liquidus temperature of the fusible layer when the second semiconductor material is a semiconductor compound, while keeping the semiconductor layer at a temperature lower than a melting temperature of the first semiconductor material and lower than a solidus temperature of the first semiconductor material when the first semiconductor material is another semiconductor compound.

12. A method for manufacturing a transistor comprising the implementation of a modification method according to claim 1, the transistor having a channel region made in said semiconductor layer.

13. The method according to claim 1, comprising arranging an amorphous layer between the fusible layer and the semiconductor layer.

14. The method according to claim 13, wherein the amorphous layer is an insulating layer.

15. The method according to claim 13, wherein the amorphous layer is the strain donor layer.

16. The method according to claim 6, wherein the insulating layer is made of silicon oxide of a semiconductor-on-insulator type substrate.

17. The method according to claim 10, wherein the pulse is comprised between 20 ns and 500 ns and the laser has a wavelength comprised between 250 nm and 400 nm.

18. The method according to claim 14, wherein the amorphous layer is one of a silicon oxide layer and silicon nitride layer.

19. The method according to claim 1, wherein the fusible layer and the strain donor layer are made of different materials.

20. The method according to claim 1, wherein etching said at least one stack of layers is stopped before reaching the support.

21. A method for modifying a strain state of at least one semiconductor layer comprising:
   a) forming over a support at least one stack of layers including said at least one semiconductor layer of a first semiconductor material and a fusible layer, said fusible layer being based on a second semiconductor material, distinct from the first semiconductor material, said fusible layer being free of dopants and arranged between the at least one semiconductor layer and the support, said at least one stack of layers further comprising a strain donor layer, the strain donor layer being based on a material having an intrinsic tensile strain, the forming of said at least one stack comprising:

forming the at least one stack of layers over said support comprising said fusible layer, said semiconductor layer, the strain donor layer, arranging the strain donor layer between the fusible layer and the semiconductor layer, and etching said at least one stack of layers so as to define said at least one stack and delimit lateral edges of the semiconductor layer, the etching of said at least one stack of layers being carried out so as to delimit lateral edges of the strain donor layer based on a material having an intrinsic tensile strain, the method further comprising, starting from said at least one stack of layers, forming, over said support, another stack topped by another strain donor layer based on a material having an intrinsic compressive strain, then, b) quick heat treatment of the fusible layer in said at least one stack using a laser, so as to cause a transitional passage of at least one thickness of the fusible layer from a solid state into a liquid state while keeping at least one thickness of the semiconductor layer in the solid state.

22. A method for modifying a strain state of at least one semiconductor layer comprising:

a) forming over a support at least one stack of layers including said at least one semiconductor layer of a first semiconductor material and a fusible layer, said fusible layer being based on a second semiconductor material, distinct from the first semiconductor material, said fusible layer being free of dopants and arranged between the at least one semiconductor layer and the support, said at least one stack of layers further comprising a strain donor layer, the strain donor layer being based on a material having an intrinsic tensile strain, the forming of said at least one stack comprising:

forming the at least one stack of layers over said support comprising said fusible layer, said semiconductor layer, the strain donor layer, and etching said at least one stack of layers so as to define said at least one stack and delimit lateral edges of the semiconductor layer, the etching of said at least one stack of layers being carried out so as to delimit lateral edges of the strain donor layer based on a material having an intrinsic tensile strain, the method further comprising, starting from said at least one stack of layers, forming, over said support, another stack topped by another strain donor layer based on a material having an intrinsic compressive strain, then, b) quick heat treatment of the fusible layer in said at least one stack using a laser, so as to cause a transitional passage of at least one thickness of the fusible layer from a solid state into a liquid state while keeping at least one thickness of the semiconductor layer in the solid state, wherein the strain donor layer is disposed above the semiconductor layer and wherein the at least one stack of layers includes an additional strain donor layer disposed beneath the semiconductor layer.

23. A method for modifying a strain state of at least one semiconductor layer comprising:

a) forming over a support at least one stack of layers including said at least one semiconductor layer of a first semiconductor material and a fusible layer, said fusible layer being based on a second semiconductor material, distinct from the first semiconductor material, said fusible layer being free of dopants and arranged between the at least one semiconductor layer and the support, said at least one stack of layers further comprising a strain donor layer, the strain donor layer being based on a material having an intrinsic tensile strain, the forming of said at least one stack comprising:

forming the at least one stack of layers over said support comprising said fusible layer, said semiconductor layer, the strain donor layer, arranging an amorphous layer between the fusible layer and the semiconductor layer, and etching said at least one stack of layers so as to define said at least one stack and delimit lateral edges of the semiconductor layer, the etching of said at least one stack of layers being carried out so as to delimit lateral edges of the strain donor layer based on a material having an intrinsic tensile strain, the method further comprising, starting from said at least one stack of layers, forming, over said support, another stack topped by another strain donor layer based on a material having an intrinsic compressive strain, then, b) quick heat treatment of the fusible layer in said at least one stack using a laser, so as to cause a transitional passage of at least one thickness of the fusible layer from a solid state into a liquid state while keeping at least one thickness of the semiconductor layer in the solid state.

* * * * *